(12) United States Patent
Lojek

(10) Patent No.: US 6,822,285 B1
(45) Date of Patent: Nov. 23, 2004

(54) EEPROM WITH MULTI-MEMBER FLOATING GATE

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/633,005

(22) Filed: Jul. 31, 2003

(51) Int. Cl.$^7$ .................. H01L 29/76; H01L 29/788; H01L 21/336; H01L 21/8238

(52) U.S. Cl. .................. 257/314; 257/315; 438/197; 438/211; 438/257

(58) Field of Search ............................ 257/314, 315, 257/316, 326; 438/197, 211, 257, 286, 294

(56) References Cited

U.S. PATENT DOCUMENTS

| | | |
|---|---|---|
| 5,108,939 A | 4/1992 | Manley et al. |
| 5,618,742 A | 4/1997 | Shone et al. ............... 438/263 |
| 5,777,361 A | 7/1998 | Parris et al. ............... 257/322 |
| 6,043,530 A | 3/2000 | Chang .................... 257/320 |
| 6,074,914 A | 6/2000 | Ogura .................... 438/257 |
| 6,124,170 A | 9/2000 | Lim et al. ................ 438/267 |
| 6,479,351 B1 | 11/2002 | Lojek et al. .............. 438/266 |

*Primary Examiner*—David Zarneke
*Assistant Examiner*—Scott B. Geyer
(74) *Attorney, Agent, or Firm*—Schneck & Schneck; Thomas Schneck

(57) ABSTRACT

An EEPROM device constructed in a first active area having a multi-element floating gate structure, including a central polysilicon body surrounded by a polysilicon spacer element and mutually separated by an upright layer of thin oxide for electron tunneling. An auxiliary active area, isolated from the first active area, is employed as a charge reservoir for programming and linked to the first active area by an extended ion implantation region. Before the poly spacer is built, the central poly body is used as an alignment mask for source and drain implants. After implanting source and drain, the thin oxide is deposited and the poly spacer is built. A poly cap makes contact with the poly spacer but not the central poly body. A hole is made through the poly cap into the central poly body and then filled with metal, electrically joining the poly cap and the connected poly spacer with the central poly body so that the multi-element floating gate structure is at the same electrical potential. The multi-element floating gate may be charged by band to band tunneling or otherwise, drawing charge from the auxiliary active area.

15 Claims, 6 Drawing Sheets

EEPROM WITH MULTI-MEMBER FLOATING GATE

TECHNICAL FIELD

The invention relates to semiconductor integrated circuit memory devices and, in particular, to an electrically erasable programmable read only memory (EEPROM) transistor.

BACKGROUND ART

EEPROM devices employ a floating gate that is a conductive electrode, insulated from other electrodes, used to store electrical charge indicative of the state of the device. The manner of reading the charge on the floating gate is well-known. For example, when charge is present on the floating gate, the device may indicate a binary zero and when charge is not present on the floating gate, a binary one is indicated. Charge is applied to the floating gate by a phenomenon known as Fowler-Nordheim tunneling, or more recently, by band-to-band tunneling. The floating gate was spaced above and separated from the substrate by a layer of thin oxide, having a thickness in the range of 40 or fewer Angstroms to about 70 Angstroms. Since this oxide is applied as a horizontal layer, there is no alignment or deposition problem. In a memory array, millions of identical memory devices are aligned in rows and columns for data storage. Each cell must be an efficient charge storage device. As devices become smaller, it becomes more difficult to maintain charge storage, leading to data retention integrity issues.

In U.S. Pat. No. 5,618,742 to F. Shone et al. a flash EPROM is shown wherein a main floating gate poly body is used for self-aligned placement of source and drain regions. Lateral poly spacers contact the main poly body to form an extended floating gate. U.S. Pat. No. 6,043,530 to M. B. Chiang, U.S. Pat. No. 6,074,914 to S. Ogura, and U.S. Pat. No. 6,124,170 to M. Lim et al. also show lateral poly spacers.

In U.S. Pat. No. 6,479,351, entitled "Method of Fabricating a Self-Aligned Non-Volatile Memory Cell", assigned to the assignee of the present invention, B. Lojek discloses a self-aligned non-volatile memory cell behaving like an EEPROM with a small, upright, conductive sidewall spacer electrically coupled and being located next to a main floating gate region. Both the small sidewall spacer and the main floating gate region are formed on a substrate and both form the floating gate of the non-volatile memory cell. Both are isolated electrically from the substrate by an oxide layer that is thinner between the small sidewall spacer and the substrate; and is thicker between the main floating gate region and the substrate.

The sidewall spacer has an adjacent thin oxide layer separating it from the main floating region creating a thin dielectric pathway for electrons to tunnel into either the spacer or the main polysilicon floating gate region, both forming the floating gate electrode. Part of the thin oxide layer is deposited vertically between the upright spacer and the main polysilicon body and part of the layer is deposited horizontally. Since the floating gate electrode is maintained at a single voltage indicating a single charge state, the multiple regions of the floating gate must be joined together by a conductive member in order to be at the same electrical potential. A layer of polysilicon applied after conductive spacer formation is usually used to join the floating spacers to the main polysilicon body. This multi-member floating gate construction is effective for providing multiple paths for tunneling through the thin oxide layer.

Separating the floating gate from the substrate is a layer of thin oxide, perhaps 30–60 Angstroms in thickness. As devices become smaller, the layer of thin oxide becomes more difficult to situate between the substrate and the floating gate. Also, the spacing and position of source and drain electrodes become more difficult to control.

An object of the invention is to provide an EEPROM device having an improved floating gate construction, with improved alignment of tunnel oxide and source and drain electrodes.

Another object of the invention is to provide a compact memory cell geometry with good charge storage and programming efficiency.

SUMMARY OF INVENTION

The above object has been met with a multi-member floating gate construction in a first active area wherein a self-alignment technique allows a uniform deposition of a thin, tunnel oxide layer in an EEPROM device that includes a vertical portion between the main floating gate body and adjacent conductive, upright conductive, sidewall spacers forming part of the floating gate. Prior to thin oxide deposition, the main floating gate body can be used as a mask for ion implantation of source and drain electrodes on opposite sides of the body. The ions are not driven deep, but just barely penetrate the substrate. The drain electrode is much larger than the source electrode, extending into an implanted region that reaches a nearby auxiliary active area, providing an unusually large charge reservoir for programming. The first active area and the auxiliary active area are adjacent, but insulated from each other. However, they share a large subsurface implanted or doped region which will serve as a reservoir for charged particles to be supplied to the floating gate. The entire footprint of the auxiliary active area is dedicated to this purpose.

A uniform thin oxide layer is deposited in a self aligned manner by first forming the main polysilicon body over an insulating layer of gate oxide and then etching back the gate oxide to the polysilicon body. It is very important that the tunnel oxide layer be both thin, preferably about 10 Angstroms, and uniform. This step is followed by vapor deposition of the thin tunnel oxide layer over the polysilicon body including its side walls. A subsequent layer of polysilicon is applied over the thin oxide layer and etched away, but not totally, leaving small corners of polysilicon adjacent to and against the main polysilicon body in a circumferential loop but separated therefrom by the previously deposited thin oxide. The residual polysilicon appears similar to nitride sidewall spacers, except that the newly formed spacers are conductive polysilicon spacers that are electrically joined to the main polysilicon body in a subsequent step.

The thin oxide between the poly spacers and the main polysilicon body allows electrons to have bidirectional tunneling opportunities, either into the main polysilicon body or into the poly spacers. This bi-directional tunneling opportunity increases the probability of electron transfers to and from the floating gate in charge transfer operations, such as write or erase operations, particularly using low voltages, and allows use of smaller polysilicon structures in forming the floating gate.

An insulative layer is deposited over the polysilicon members and later a conductive cap is deposited over the insulative layer joining multiple members of the floating gate. A hole formed through the cap is filled with metal, allowing joinder of the conductive cap to underlying floating gate members so that the main polysilicon body and the conductive spacers are at the same electrical potential. The extended drain structure, cooperating with the multi-element floating gate structure leads to a compact memory cell geometry with good charge storage and programming efficiency.

DESCRIPTION OF THE INVENTION

Figure 1:
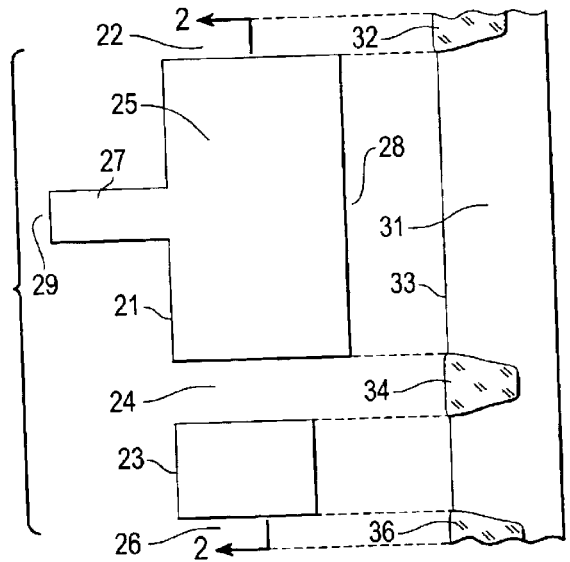
FIG. 1 is a top view of first and second active areas defining memory cell footprints on a semiconductor substrate in accordance with the present invention.

With reference to FIG. 1, a footprint 21 defines a first active area of a memory transistor. A second footprint 23, smaller than footprint 21, defines a second active area of an auxiliary region to be used to apply a tunneling or programming voltage. The entire auxiliary region 23 will become part of a subsurface doped region, extending to a stripe crossing the width of the first active region 21, and having a sufficient ion reservoir for providing sufficient charge to the floating gate for programming. The active areas are those silicon wafer areas that are doped and used in transistor construction. The regions outside of the active areas are isolated, as will be seen below. For example, lateral zones 22, 24, and 26 are outside of the active area and will be isolated so that one active area does not communicate with another, except by shared electrical paths. The implanted auxiliary region 23 may exceed the area of the shared stripe path, an implanted region, crossing the width of the first active area 21. Regions 28 and 29 are width-wise zones which are outside the active area and similarly isolated. The central region defined by footprint 21 is the main active area 25. An extension 27 to the left of the main active area provides for a source electrode of different and much smaller length dimension than the drain, as will be seen below.

Figure 2:
FIG. 2 is a side sectional view of the memory cell footprint illustrated in FIG. 1, taken along lines 2—2, with isolation regions bordering active areas.

Turning to FIG. 2, doped substrate 31 is a semiconductor body having an upper surface 33 upon which features are constructed. Features may also be constructed by implantation into the substrate 31 as will be discussed below. Isolation regions 32, 34, and 36 are shallow trench isolation (STI) regions which separate one active area of the substrate from another.

Figure 3:
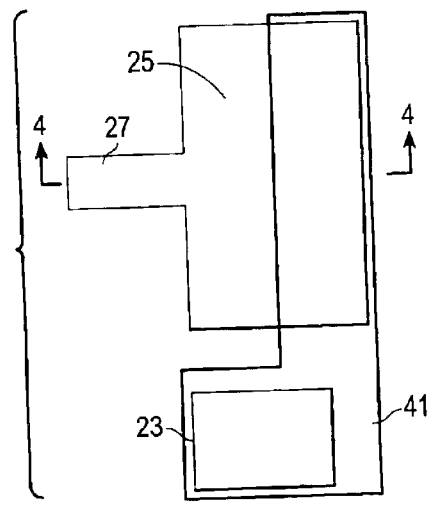
FIG. 3 is a top view of a memory cell footprint as in FIG. 1, with an overlay of a mask for doping substrate regions.
Figure 4:
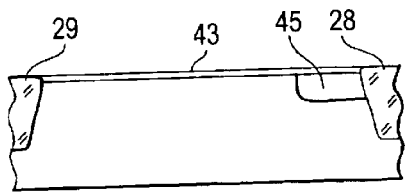
FIG. 4 is a side sectional view along lines 4—4 in FIG. 3.

After the active areas have been defined, a layer of screen oxide 43, shown in FIG. 4, i.e. a thermal oxide, is grown over the entire surface prior to positioning the implant mask 41, shown in FIG. 3. The implant mask defines a N+ region where ions will be implanted, for example, arsenic ions. The implant region defines a wide stripe across the main active area 25 which will serve as a supply or sink for electrons to be transferred to the floating gate structure. The stripe across the entire width of the active region 25 ensures a good supply of charged particles, while allowing some slight misalignments in positioning the floating gate. The stripe is enhanced by implanting over the entire auxiliary active region 23, or at least most of it. The auxiliary region assures a good supply of charge for movement to the charge storage regions, namely the floating gate.

In FIG. 4, it is seen that the screen oxide layer 43 has been stripped off of the isolation regions 28 and 29. The ion implant region 45 is a N+ subsurface highly doped region in the substrate 31 immediately below the upper surface 33, occupying the implant mask region 41.

Figure 5:
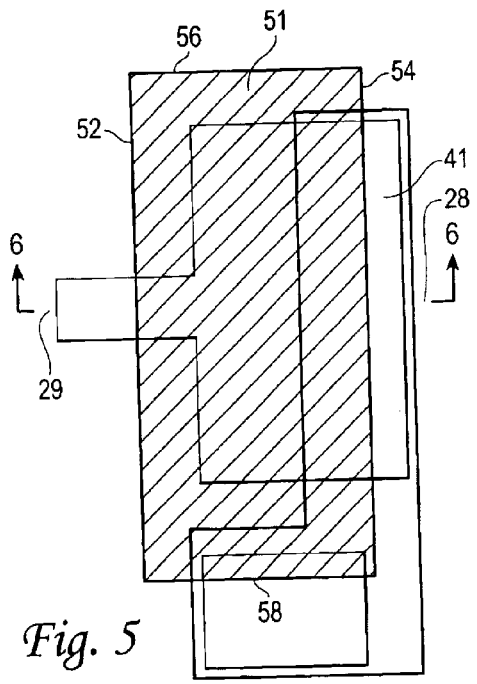
FIG. 5 is a top view of a memory cell footprint as in FIG. 3, with a first polysilicon layer etched to a rectangular pattern.
Figure 6:
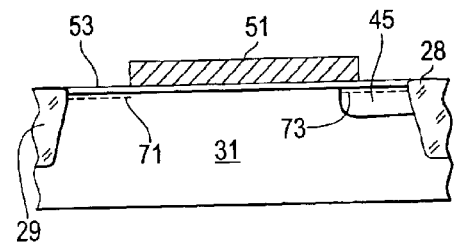
FIG. 6 is a side section view along lines 6—6 in FIG. 5.

In FIGS. 5 and 6, those portions of the gate oxide layer extending beyond the footprint edges 52, 56, 54, 58 of the first etched poly layer 51 are removed. Upon removal, there is a single ion implantation of electrodes including a first electrode implant region 71 and a second electrode implant region 73, with the first electrode implant region being a future source electrode and the second electrode implant region 73 being a future drain electrode implant within the implant mask region 41. Note that the implant regions are barely below the surface of the substrate. The main floating body 51 acts as alignment mask for the first and second electrode implant regions 71 and 73 so that these electrodes are essentially self aligned with the left and right edges of the rectangular main floating body 51.

Once the implantation is complete, the screen oxide may be stripped from exposed areas. However, a layer of gate oxide 53 remains below the main floating body 51. Gate oxide 53 is a rectangular deposition covering most of the main active area 25, as well as a portion of the footprint 23 of the auxiliary active area. Atop the gate oxide layer is first polysilicon layer 51 etched to a rectangle mostly over the main active area 25. The polysilicon layer 51 is etched to the rectangular shaded pattern seen in FIG. 5. Over the top of the first polysilicon layer 51, a very thin tunnel oxide layer 61 is grown which may be more clearly seen in FIG. 8.

Figure 7:
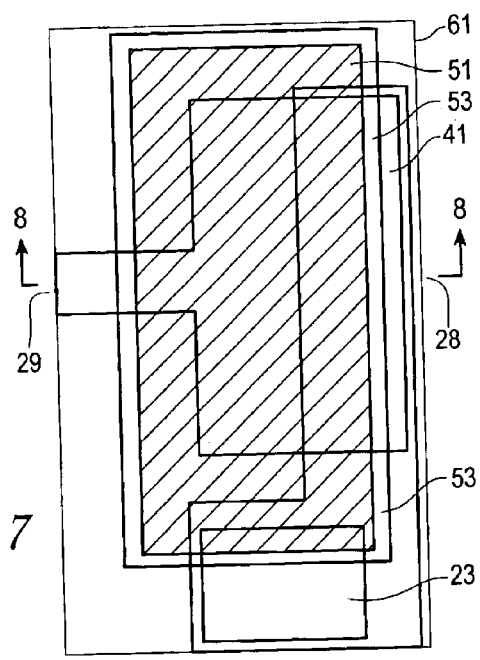
FIG. 7 is a top view of a memory cell footprint as in FIG. 5, with a tunnel oxide layer etched to a rectangular pattern and an overlying second polysilicon layer overlying the oxide layer removed except for a poly spacer region appearing as a rectangle.
Figure 8:
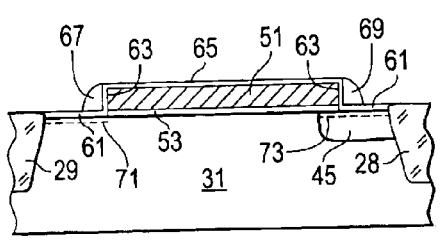
FIG. 8 is a side sectional view along lines 8—8 in FIG. 7.

FIGS. 7 and 8 and as described above, the gate oxide layer 53 is seen to be above substrate 31 and above implant mask region 41. The first polysilicon layer 51, etched to a rectangular main floating body, is seen to be above the gate oxide layer. Now, the thin tunnel oxide layer 61 is grown over the main floating body, extending over the substrate on both sides. The thin oxide layer has a vertical portion 63 rising along a vertical wall of the first polysilicon layer and then having a top mesa portion 65, sometimes called poly oxide. The thickness of the thin oxide layer is in the range of 30–70 Angstroms.

In FIG. 8, conductive polysilicon spacers 67 and 69 are seen to resemble nitride spacers of the prior art and be insulated from the first polysilicon layer 51 by the vertical portion 63 of the tunnel oxide. The spacers are also insulated from the substrate by the tunnel oxide layer 61. It will be seen that both the main floating body 51, as well as the poly spacer 69 both reside above the subsurface ion implantation region 45. The ion implantation region can supply charge, i.e. electrons, to both the main floating body 51 as well as the poly spacer 69 through a vertical portion 63 of the tunnel oxide. In other words, electrons migrating through the tunnel oxide have two paths to reach a floating member, with one path being into the main floating body 51 and the other path being into the poly spacer 69. This is thought to enhance the probability of electron capture into a floating body.

Figure 9:
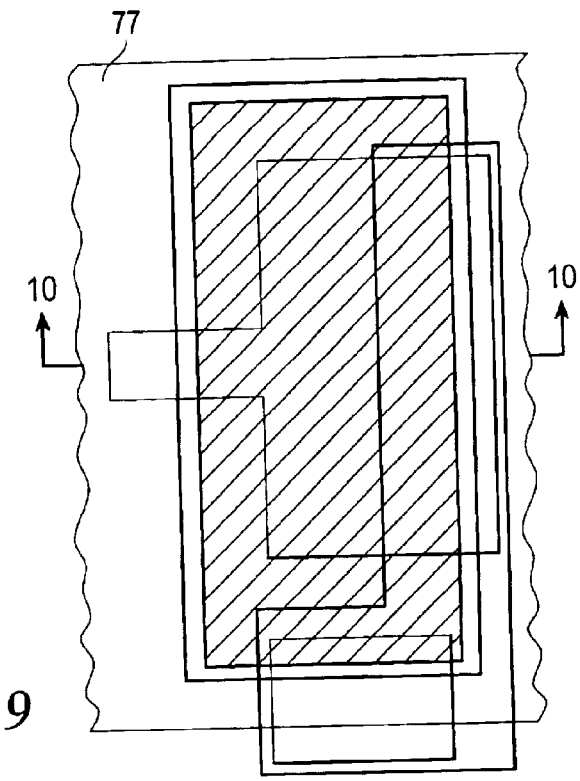
FIG. 9 is a top view of a memory cell footprint as in FIG. 7, with a third polysilicon layer overlying other layers.
Figure 10:
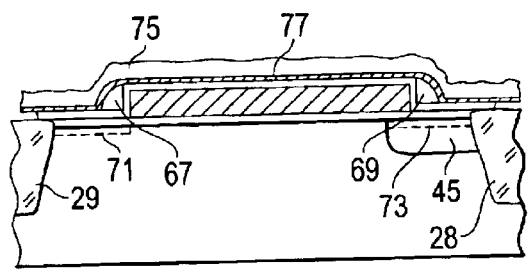
FIG. 10 is a side sectional view along lines 10—10 in FIG. 9, showing source and drain implants and a TEOS layer, all applied before the third polysilicon layer of FIG. 9.
Figure 11:
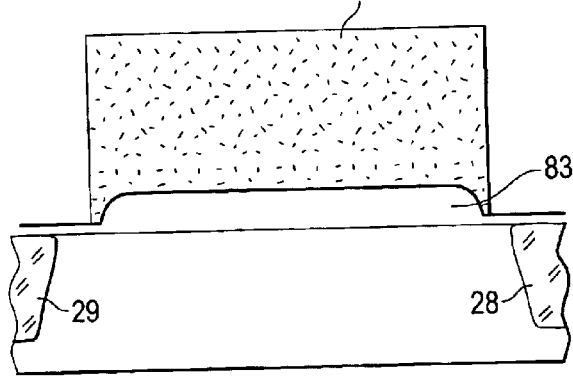
FIG. 11 is a side sectional view showing the structure of FIG. 10 with a photomask over the central raised third polysilicon layer.

With reference to FIG. 9, a third poly layer 77 is deposited over the top of the structure seen in FIG. 8. The function of the third poly layer will be to electrically connect the first and second layers. In FIG. 10, the third poly layer 77 is seen to itself be capped by a dielectric layer 75 which may be a TEOS layer which follows the contours of the structure below so that the mesa feature described above is preserved. In FIG. 11, the mesa feature has been simplified by a single body 83 which includes all of the elements seen in FIG. 10, both above the upper surface of the substrate and below. A photomask 81 is applied over the mesa feature, well within the isolation regions 28 and 29. The photomask 81 allows removal of all layers to the outside of the mask, stopping at the substrate. Once all layers outside the mesa structure are removed, the mask itself is removed.

Figure 12:
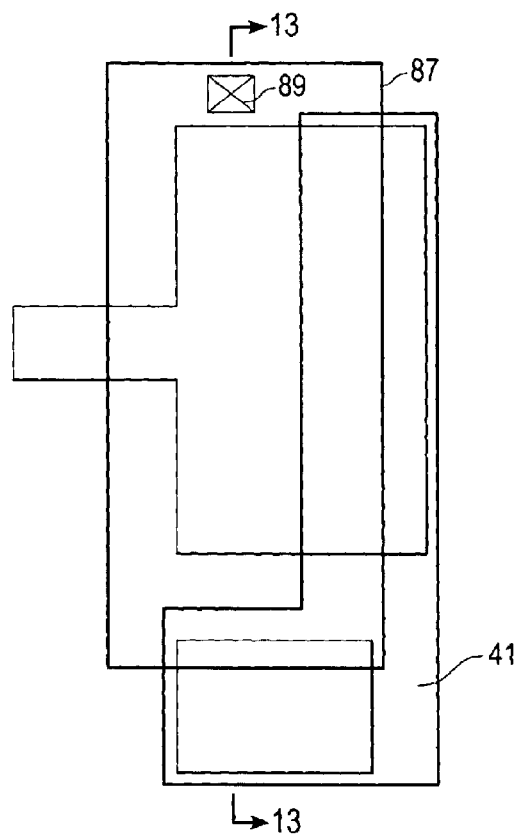
FIG. 12 is a top view of a memory cell footprint as in FIG. 9, with a new third polysilicon boundary formed by etching to the substrate.
Figure 13:
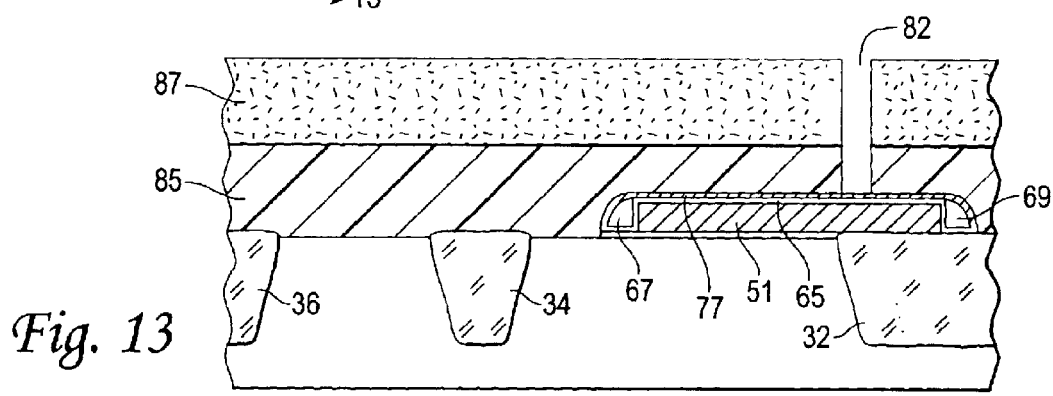
FIG. 13 is a side sectional view along lines 13—13 in FIG. 12 with additional ILD and contact mask layers over the entire structure.
Figure 14:
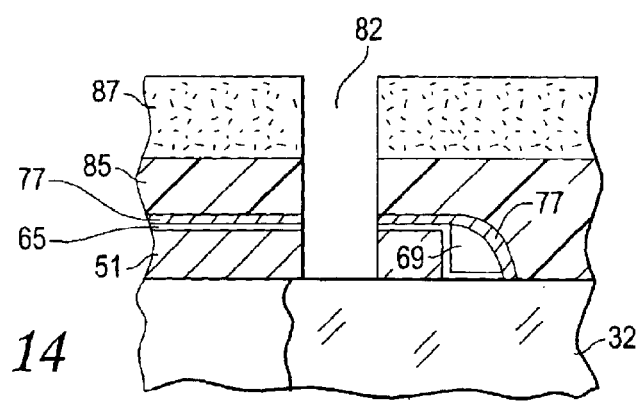
FIG. 14 is a side sectional detail of a cut through the layers shown in FIG. 13.

Considering FIGS. 12, 13, and 14, an interlayer dielectric (ILD) region 85 is applied directly over the substrate, over the implant mask region 41 and over the mesa feature. A photoresist contact mask 87 is applied above the dielectric layer 85. A cell contact 89 is located longitudinally outside of the active area over a portion of the isolation region. In FIG. 13 it may be seen that a hole 82 is patterned in the photoresist layer 87, with the hole extending into the mesa feature, with the hole near but not contacting poly spacer 69. The hole extends through a portion of the rectangular main floating body 51. In FIG. 14 the hole may be seen to extend through the floating body 51, the poly oxide 65, the third poly layer 77, the ILD layer 85, and the contact photomask layer 87.

Figure 15:
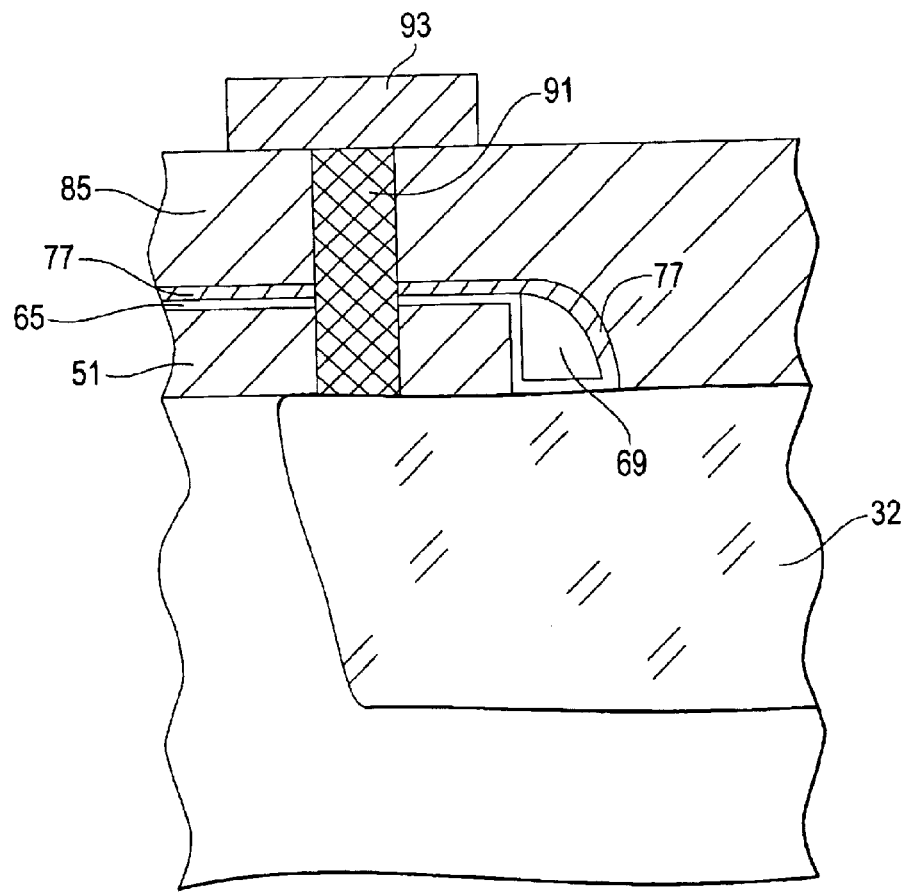
FIG. 15 is a top view of a memory cell footprint as in FIG. 12, with contact positions shown.

In FIG. 15, the hole 82 is seen to be filled with a metal filler 91, preferably a tungsten plug which may be sputtered into the hole, covered by contact 93. Poly spacer 69 is seen to make contact with third poly layer 77. In turn, the metal plug 91 connects the third layer 77 with the main floating body 51 so that the main floating body and the poly spacer are at the same electrical potential, a very important connection.

Figure 16:
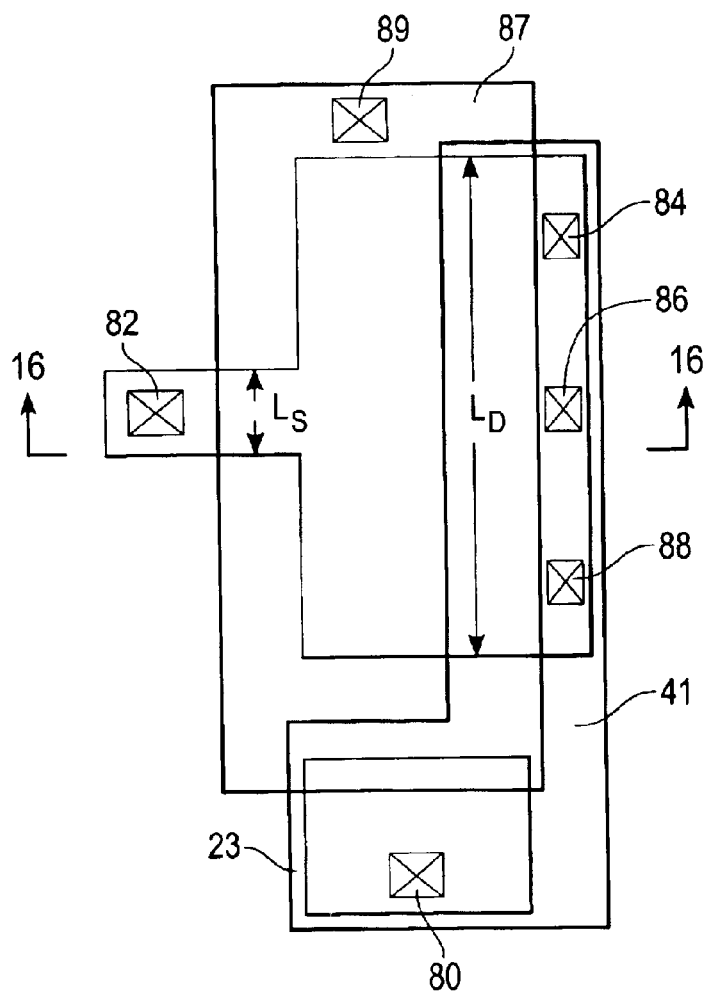
FIG. 16 is a side sectional detail as in FIG. 14, with the cut being filled and capped.
Figure 17:
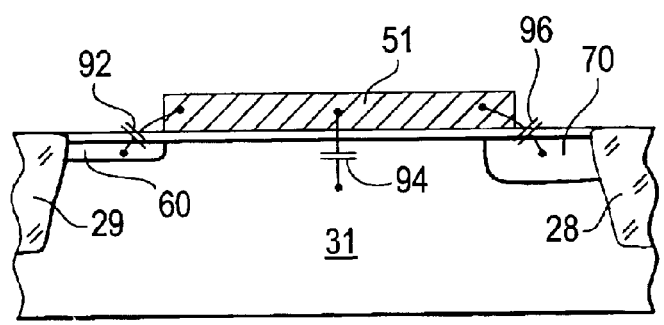
FIG. 17 is a side sectional view along lines 16—16 in FIG. 16.

In FIG. 16, it will be seen that the contact mask may be provided with additional contacts 80, 82, and 84, 86 and 88 for making electrical contact with outside connections. The contacts 84, 86 and 88 are closely spaced along the implant region 41 to spread current uniformly. In FIG. 17, the first implant has been driven to form source electrode 60 and the second implant has been driven to form drain electrode 70.

An inherent capacitance $C_{gs}$, 92, exists between the source electrode 60 and the floating gate main body 51. A second inherent capacitance $C_{gc}$, 94, exists between gate 51 and substrate 31. A third inherent capacitance $C_{gd}$, 96, exists between the main body 51 and drain 70.

Returning to FIG. 16, the dimension $L_S$ indicates the relative length of the source, while the dimension $L_D$, seen above the implant mask region 41, indicates the relative length of the drain. $L_D$ is much greater than $L_S$. This leads to $C_{gs}$ being much smaller than $C_{gd}$.

This allows a high capacitance coupling of the floating gate voltage during programming which will be approximately $$V_{FG} \approx \frac{C_{gd}}{\Sigma C} V_{plate}$$

where $V_{plate}$ is the voltage applied to the subsurface implant region 41 and where $\Sigma C = C_{gs} + C_{gd} + C_{gc}$. Considering applied voltages $V_g$ may be calculated as follows:

$$V_g = \frac{C_{gs}}{\Sigma C} V_S + \frac{C_{gd}}{\Sigma C} V_D + \frac{C_{gc}}{\Sigma C} V_B$$

where $V_S$ is the voltage applied to the source electrode, $V_D$ is the voltage applied to the drain electrode and $V_B$ is the substrate bias voltage. The mechanism for charge transfer is Fowler-Nordheim or band-to-band tunneling and the reading of charge is accomplished in the usual way.

Typical programming voltage will be on the order of 5 volts, thereby allowing low voltage programming. Other voltages will be less than 5 volts, allowing memory arrays having memory devices as described herein to efficiently store charge in compact memory cells as described herein.

What is claimed is:

1. A multi-element floating gate for an EEPROM comprising:
    a main polysilicon body disposed over a semiconducting substrate and electrically insulated therefrom in a first active region;
    source and drain implants within the semiconducting substrate on opposed sides of the main polysilicon body, the drain implant having a size exceeding the source implant;
    a polysilicon spacer disposed over the semiconducting substrate and electrically insulated therefrom and spaced from the main polysilicon body by a layer of thin oxide, the thin oxide extending over the main polysilicon body, all in the first active region;
    a polysilicon cap disposed over the polysilicon spacer in electrical contact therewith and disposed over the thin oxide on the main polysilicon body, the polysilicon cap having a metal filled hole through the cap and through the main polysilicon body whereby metal in the hole electrically joins the main polysilicon body with the polysilicon spacer;
    a second active region having an implanted region, the second active region insulated from the first active region, said drain implant electrically extending to the implanted region in the second active region wherein a charge storage reservoir is provided for programming.

2. The device of claim 1 wherein the polysilicon spacer surrounds the main polysilicon body.

3. The device of claim 1 where the semiconducting substrate has at least one of the source and drain implants beneath the polysilicon spacer.

4. The device of claim 1 wherein said second active region is smaller than the first active region.

5. The device of claim 1 wherein the implanted region in the second active region occupies the entire second active region.

6. The device of claim 5 wherein said charge storage reservoir associated with the second active region is larger than in the first active region.

7. A method of making a multi-element floating gate for an EEPROM comprising:

depositing a first polysilicon layer over a semiconducting substrate and electrically insulated therefrom and etching away polysilicon leaving a main polysilicon body;

depositing a second polysilicon layer in an insulated relation over the main polysilicon body and then etching away the polysilicon, leaving a polysilicon spacer near the main polysilicon body, electrically insulated from the substrate and spaced from the main polysilicon body by a layer of thin oxide, the thin oxide extending over the main polysilicon body;

depositing a third polysilicon layer over the polysilicon spacer and in electrical contact therewith and over thin oxide on the main polysilicon body;

forming a hole in the polysilicon cap through the cap and through the main polysilicon body, filling said hole with conductive material whereby conductive material in the hole electrically joins the main polysilicon body with the polysilicon spacer.

8. The method of claim 7 further defined by implanting charged particles into the semiconducting substrate using the main polysilicon body as an alignment mask.

9. The method of claim 8 further defined by connecting the implanted charged particles as source and drain regions relative to the main polysilicon body.

10. The method of claim 8 wherein the second polysilicon layer is deposited after the implanting of charged particles.

11. A method of making a floating gate EEPROM device comprising:

defining first and second mutually isolated active areas on a semiconductor substrate;

forming a conductive, electrically floating, polysilicon region in the first active area, separated from the substrate by a corresponding areawise region of gate oxide, with a common pair of opposed edges over the substrate;

implanting source and drain regions in the substrate self-aligned with the opposed edges of the polysilicon region, the drain region being larger than the source and extending from the first active region into the second active region;

forming conductive, electrically floating poly spacers near opposed edges of the conductive polysilicon region and over the source and drain regions, separated from the source and drain regions and from the polysilicon region by a layer of tunnel oxide, thereby forming a mesa feature over the substrate;

covering the mesa feature with a capping dielectric layer;

depositing a polysilicon layer over the capping dielectric layer;

making a hole in the mesa feature penetrating polysilicon layer;

filling the hole with conductive material, thereby electrically joining the poly spacers to the conductive region and forming a single floating gate.

12. The method of claim 11 further defined by selectively doping the substrate in a region forming a portion of the second active region prior to forming the conductive, electrically floating polysilicon region.

13. The method of claim 11 wherein the electrically floating, polysilicon region in the first active area is formed by depositing a first polysilicon layer over the substrate, separated therefrom by oxide and etching away polysilicon except for said polysilicon region.

14. The method of claim 13 wherein the conductive, electrically floating polysilicon region is formed by depositing a second layer of polysilicon layer over the substrate and said polysilicon region, separated therefrom by oxide and etching away polysilicon except for the floating spacers.

15. The method of claim 14 wherein the conductive, electrically floating spacers are formed by depositing a third layer polysilicon layer over the floating spacers and the polysilicon region, separated therefrom by oxide.

* * * * *